US011742812B2

(12) United States Patent
Roy et al.

(10) Patent No.: US 11,742,812 B2
(45) Date of Patent: *Aug. 29, 2023

(54) OUTPUT POLE-COMPENSATED OPERATIONAL AMPLIFIER

(71) Applicant: TEXAS INSTRUMENTS INCORPORATED, Dallas, TX (US)

(72) Inventors: Aniruddha Roy, Bengaluru (IN); Saurabh Pandey, Bengaluru (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 17/242,971

(22) Filed: Apr. 28, 2021

(65) Prior Publication Data

US 2021/0250006 A1    Aug. 12, 2021

Related U.S. Application Data

(63) Continuation of application No. 16/437,188, filed on Jun. 11, 2019, now Pat. No. 11,025,213.

(51) Int. Cl.
*H03F 3/45* (2006.01)
*H03F 3/68* (2006.01)

(52) U.S. Cl.
CPC .......... *H03F 3/45246* (2013.01); *H03F 3/68* (2013.01); *H03F 2203/45288* (2013.01); *H03F 2203/45344* (2013.01); *H03F 2203/45356* (2013.01); *H03F 2203/45374* (2013.01)

(58) Field of Classification Search
CPC ................. H03F 3/45246; H03F 3/68; H03F 2203/45288; H03F 2203/45344; H03F 2203/45356; H03F 2203/45374; H03F 2200/297; H03F 2203/45138; H03F 2203/45318; H03F 2203/45652; H03F 1/086; H03F 3/45192; H03F 3/45475; H03F 3/45; H03F 3/45183; H03F 3/45179; H03F 3/45089; H03F 3/45071; H03F 3/45085
USPC .................................................. 330/253, 257
See application file for complete search history.

(56) References Cited

U.S. PATENT DOCUMENTS

| 5,028,881 | A | 7/1991 | Jackson |
| 5,625,317 | A | 4/1997 | Deveirman |
| 7,042,256 | B2 * | 5/2006 | Brenden ............. H03F 3/45183 327/423 |

(Continued)

FOREIGN PATENT DOCUMENTS

WO    WO 2004/049557 A2    6/2004

OTHER PUBLICATIONS

PCT International Search Report; PCT/US 2020/036572; dated Aug. 13, 2020; 2 pages.

*Primary Examiner* — Khanh V Nguyen
(74) *Attorney, Agent, or Firm* — Krista Y. Chan; Frank D. Cimino (57) ABSTRACT

A circuit includes a first transconductance stage having an output. The circuit further includes an output transconductance stage, and a first source-degenerated transistor having a first control input and first and second current terminals. The first control input is coupled to the output of the first transconductance stage. The circuit also includes a second transistor having a second control input and third and fourth current terminals. The third current terminal is coupled to the second current terminal and to the output transconductance stage.

20 Claims, 12 Drawing Sheets

(56) References Cited

U.S. PATENT DOCUMENTS

| | | | |
|---|---|---|---|
| 7,310,016 B2 | 12/2007 | Chuang | |
| 7,777,531 B2 * | 8/2010 | Fattaruso | H03F 3/45237 |
| | | | 327/67 |
| 8,289,832 B2 * | 10/2012 | Li | H03K 5/01 |
| | | | 369/116 |
| 2017/0026007 A1 | 1/2017 | Zhang et al. | |

* cited by examiner

OUTPUT POLE-COMPENSATED OPERATIONAL AMPLIFIER

CROSS-REFERENCE TO RELATED APPLICATIONS

This application is a continuation of and claims priority to U.S. patent application Ser. No. 16/437,188, filed on Jun. 11, 2019, which is incorporated herein by reference in its entirety.

BACKGROUND

Operational amplifiers (op amps) are used for a variety of purposes. One such purpose is as a buffer to provide a reference voltage for an analog-to-digital converter (ADC). A large capacitor may be coupled to an op amp, and such op amps are often output-pole compensated for stability (i.e., to reduce ringing on the buffer's output node).

SUMMARY

In one example, a circuit includes a first transconductance stage coupled to an input node. The circuit also includes an output transconductance stage and a second transconductance stage coupled between the first and output transconductance stages. The second transconductance stage includes a first source-degenerated transistor.

BRIEF DESCRIPTION OF THE DRAWINGS

For a detailed description of various examples, reference will now be made to the accompanying drawings in which.

DETAILED DESCRIPTION

Figure 1:
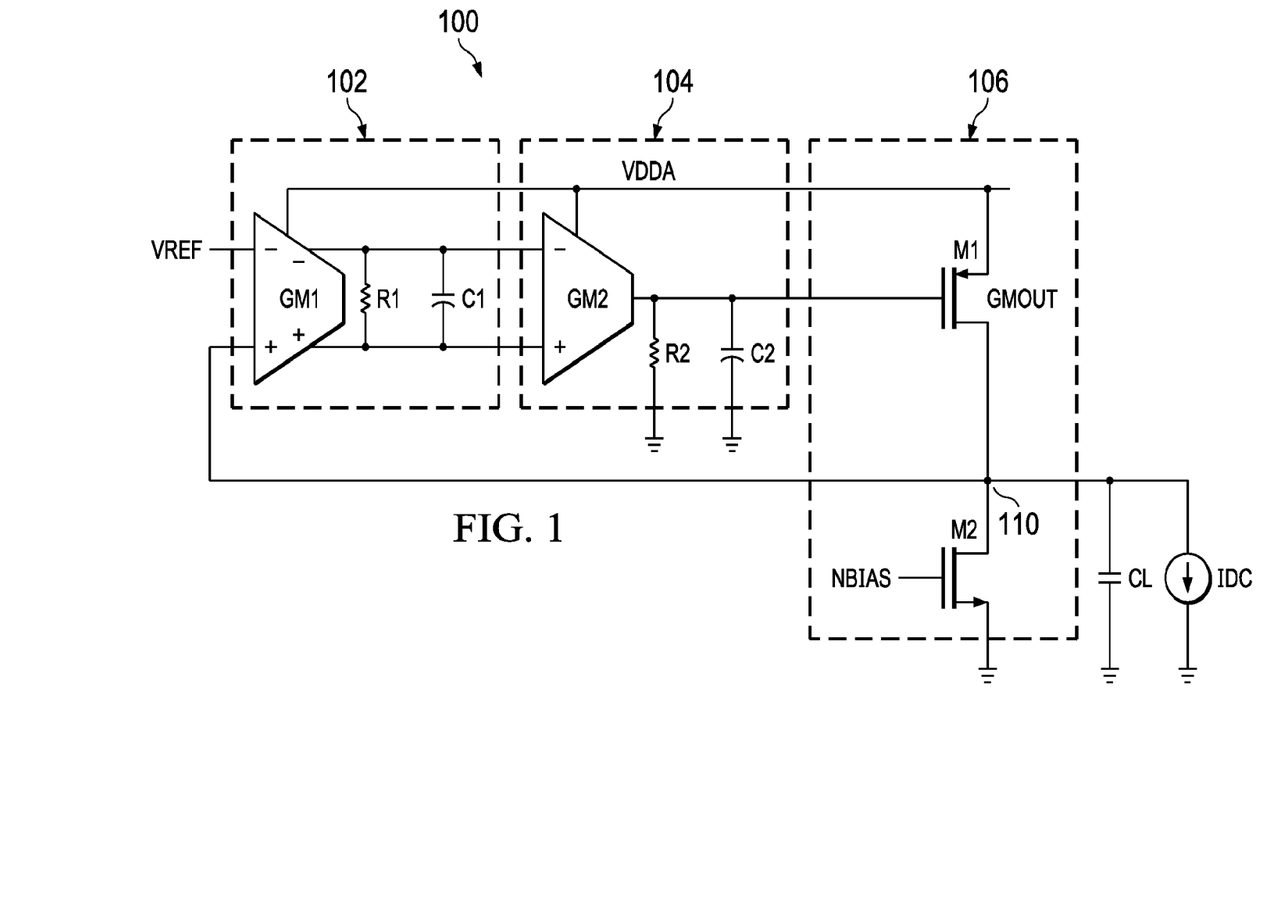
FIG. 1 illustrates an example of an op amp that has a limited output current range due to stability issues.

Some op amps not only have a large capacitor as noted above, but also support a large direct current (DC) current for a class A or AB output stage. The transconductance of the output stage of the op amp may vary with current to/from the load. FIG. 1 shows an example of at least a portion of an op amp 100. Op amp 100 in this example includes three stages—an input transconductance stage 102, an output transconductance stage 106, and a transconductance stage 104 coupled between the input transconductance stage 102 and the output transconductance stage 106. The input transconductance stage 102 includes a transconductance (GM) amplifier GM1 (GM1 also refers to the value of transconductance of the amplifier), resistor R1, and capacitor C1. The transconductance stage 104 includes GM amplifier GM2 (GM2 also refers to the value of transconductance of the amplifier), resistor R2, and capacitor C2. The output transconductance stage 106 includes transistors M1 and M2. The transconductance of M1 is GMOUT.

GM amplifier GM1 is a differential amplifier having positive (+) and negative (−) inputs and positive and negative outputs. Resistor R1 and capacitor C1 are coupled in parallel between the positive and negative outputs of GM amplifier GM1 and across the positive and negative inputs of GM amplifier GM2. GM amplifier GM2 also has positive and negative inputs and a single output coupled to resistor R2 and capacitor C2 as shown. Resistor R2 and capacitor C2 are coupled in parallel between the output of GM amplifier GM2 and ground. The output of GM amplifier GM2 is also coupled to the control input of transistor M1. In this example, transistor M1 is a p-type metal oxide semiconductor field effect transistor (PMOS transistor), and transistor M2 is an n-type metal oxide semiconductor field effect transistor (NMOS transistor). The control input of transistor M1 is the gate of M1, which is coupled to the output of GM amplifier GM2, resistor R2, and resistor C2. The gate of M2 is biased at a voltage labeled NBIAS, which is sufficiently large to turn on transistor M2 and operate it in the saturation region. The drains of transistors M1 and M2 are connected together at a node 110 which provides the output voltage of the op amp 100. Capacitor CL is external to the op amp 100, that is, capacitor CL is provided separate from the semiconductor die comprising GM amplifier GM1, GM amplifier GM2, resistor R1, resistor R2, capacitor C1, capacitor C2, transistor M1, and transistor M2. The current source IDC represents the DC current to the load. The load current in this example is a "source" current in that current flows from supply voltage node VDDA, through the transistor M1, and through the load to ground.

The bandwidth of op amp 100 is given by:

$$BW = GM1 * R1 * GM2 * R2 * GMOUT / CL \qquad (1)$$

where BW is bandwidth of the op amp. The transconductance of M1 (GMOUT) is a function of the DC load current (IDC). Thus, GMOUT increases as the load current increases. Further, as GMOUT increases, per Eq. (1), the bandwidth (BW) of the op amp 100 also increases. As such, the bandwidth of the op amp is directly proportional to load current. The non-dominant poles of the op amp's transfer function are located at frequencies given by $1/(R1*C1)$ and by $1/(R2*C2)$. Despite the op amp's bandwidth increasing as load current increases, the non-dominant poles do not scale with load current and thus remain at $1/(R1*C1)$ and $1/(R2*C2)$. As such, as load current increases, the op amp's phase margin decreases, and the output voltage will experience oscillations as the phase margin becomes low (e.g., 15 degrees). In the example of FIG. 1, the decrease in phase margin with increasing load current thus imposes an upper limit on DC current to the load to avoid instability.

Figure 2:
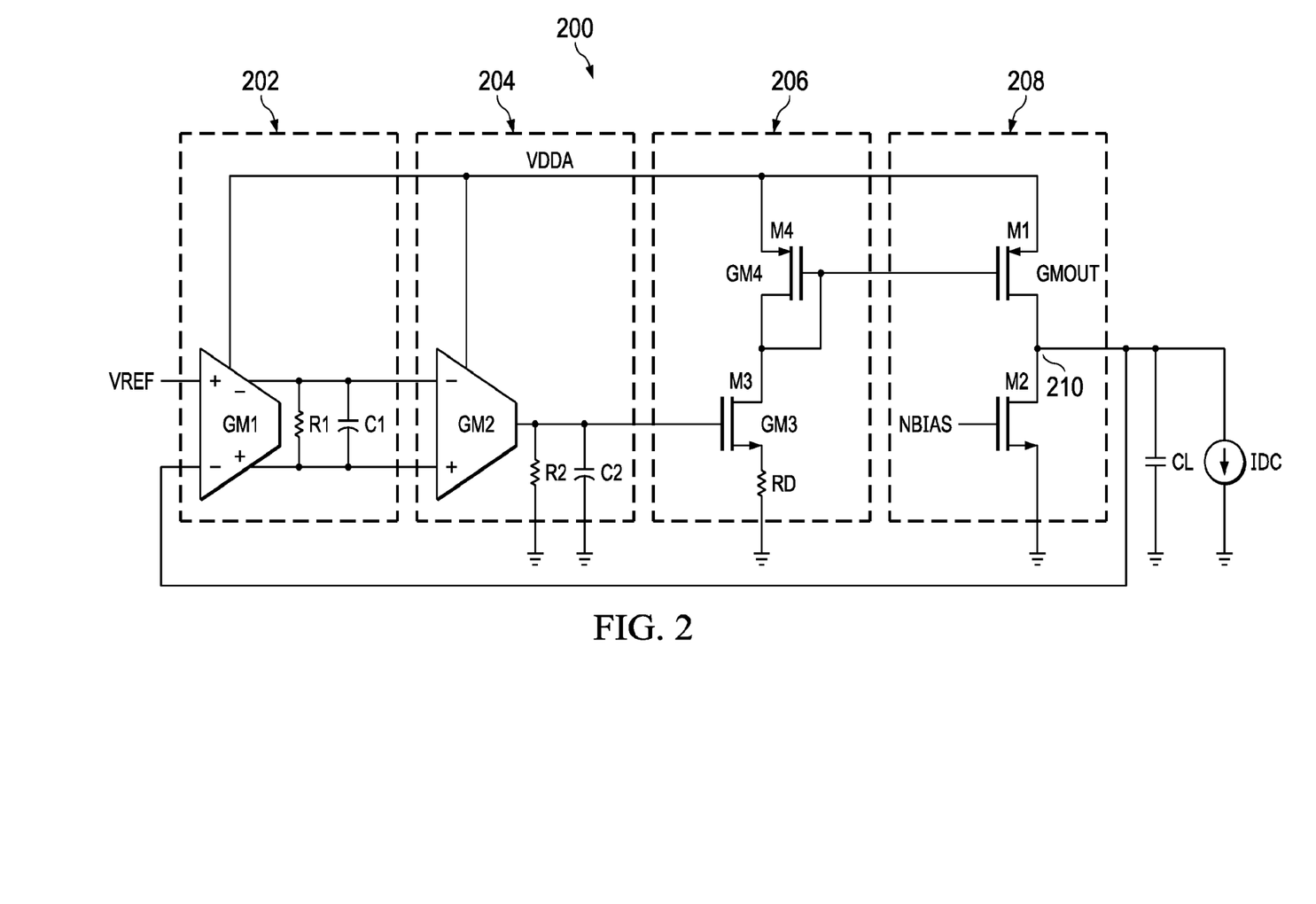
FIG. 2 illustrates another example of an op amp that addresses the stability issues of FIG. 1.

FIG. 2 shows an example of at least a portion of an op amp 200 that solves the instability problem of op amp 100 of FIG. 1. Op amp 200 in this example includes four stages—an input transconductance stage 202, an output transconductance stage 208, and transconductance stages 204 and 206 coupled between the input transconductance stage 202 and the output transconductance stage 208. The input transconductance stage 202 includes GM amplifier GM1, resistor R1, and capacitor C1. The transconductance stage 204 includes GM amplifier GM2, resistor R2, and capacitor C2. The output transconductance stage 208 includes transistors M1 and M2.

As was the case for the example of FIG. 1, GM amplifier GM1 is a differential amplifier having positive (+) and negative (−) inputs and positive and negative outputs. Resistor R1 and capacitor C1 are coupled in parallel between the positive and negative outputs of GM amplifier GM1 and across the positive and negative inputs of GM amplifier GM2. GM amplifier GM2 also has positive and negative inputs and a single output coupled to resistor R2 and capacitor C2 as shown. Resistor R2 and capacitor C2 are coupled in parallel between the output of GM2 and ground.

Transconductance stage 206 includes transistors M3 and M4 and resistor RD. In this example, transistor M3 is an NMOS transistor and transistor M4 is a PMOS transistor. The source of transistor M4 is coupled to the supply voltage node VDDA. The drains of transistors M3 and M4 are connected together. The source of transistor M3 is connected to resistor RD. Resistor RD is coupled between transistor M3 and ground. The inclusion of resistor RD connected to the source of transistor M3 means that transistor M3 is "source-degenerated." As such, transconductance stage 206 includes a source-degenerated transistor. The output of GM amplifier GM2 is coupled to the gate of transistor M3. The transconductance of transistor M3 is GM3, and the transconductance of transistor M4 is GM4.

The output transconductance stage includes transistors M1 and M2. Transistor M1 is a PMOS transistor, and transistor M2 is an NMOS transistor. The transconductance of transistor M1 is GMOUT. The gate of transistor M1 is connected to the gate of transistor M4. The gates of transistor M1 and M4 are connected to the drain of transistor M4. Transistors M1 and M4 are configured as a current mirror, such that the drain current through transistor M4 is proportional to the drain current through transistor M1. The drains of transistors M1 and M2 are connected together at a node 210 which provides the output voltage of the op amp 200. The source of transistor M2 is connected to ground. External capacitor CL is connected to node 210.

The bandwidth of op amp 200 is given by:

$$BW = GM1*R1*GM2*R2*\left(\frac{GMOUT}{GM4}\right)*GM3D/CL \quad (2)$$

where GM3D is the transconductance of source-degenerated transistor M3, and is given as:

$$GM3D=GM3/(1+GM3*RD) \quad (3)$$

As explained above, GMOUT scales with DC load current, and thus increases with increasing load current. However, due to the current mirror configuration of transistors M1 and M4, the bandwidth of op amp 200 is proportional to the ratio of GMOUT to GM4, as can be seen from Eq. 2 above. Further, as load current increases, the drain current through transistor M4 also increases due to the current mirror configuration of transistors M1 and M4, and thus the ratio of GMOUT to GM4 does not change. Increasing drain current through transistor M4 results in increased drain current through transistor M3. As such, the drain current transistor M3 is proportional to the DC load current. The bandwidth of the op amp 200 is a function of, in part, GM3D. From Eq. (3), it can be seen that GM3D approaches 1/RD as GM3 becomes large. That is, GM3D increases with increasing load current, but saturates at 1/RD due to transistor M3 being source-degenerated. In sum, the effect of including source-degenerated transistor M3 is that the bandwidth of op amp 200 does not change nearly as dramatically with changes in DC load current as was the case for op amp 100 of FIG. 1. Thus, op amp 200 is more stable (has a larger phase margin) over a larger range of DC load currents than op amp 100.

Figure 3:
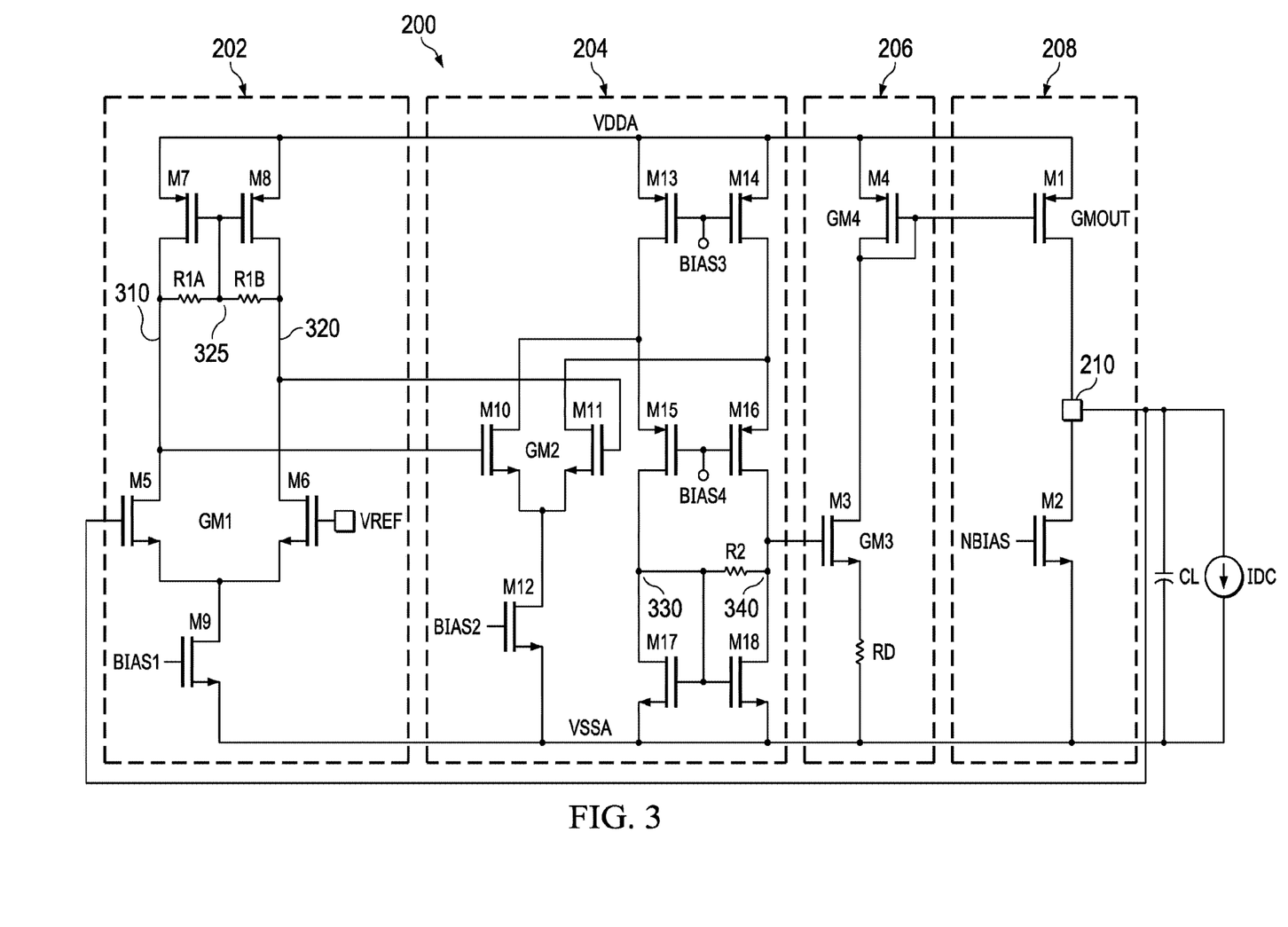
FIG. 3 shows a more detailed schematic of the example of FIG. 2.

FIG. 3 shows a more detailed schematic of the op amp 200 of FIG. 2. Additional detail is show for GM amplifiers GM1 and GM2. In this example, GM amplifier GM1 includes NMOS transistors M5, M6, and M9 and PMOS transistors M7 and M8. The sources of transistors M7 and M8 are connected to the supply voltage node VDDA. The drains of transistors M5 and M7 are connected together at node 310, and the drains of transistors M6 and M8 are connected together at node 320. Resistor R1 from FIG. 2 is implemented in the example of FIG. 3 as two resistors R1A and R1B connected in series between nodes 310 and 320. The mid connection point 325 of series-connected resistors R1A and R1B is connected to the gates of transistors M7 and M8. The sources of transistors M5 and M6 are connected together and to the drain of M9. The source of transistor M9 is connected to a negative supply voltage node VSSA. The gate of transistor M9 is biased via bias voltage BIAS1 to cause a tail current to flow through transistor pair M7 and M5, or through transistor pair M8 and M6 depending on the relative sizes of the input voltages on the gates of transistors M5 and M6. The input voltage on the gate of transistor M6 is the reference voltage VREF, and the input voltage on the gate of transistor M5 is the output voltage from node 210. In one example, capacitor C1 from FIG. 2 is the parasitic capacitance on nodes 310 and 320. The parasitic capacitance on node 310 is the sum of transistor M10's gate parasitic capacitance, transistor M5's drain parasitic capacitance, and transistor M7's drain parasitic capacitance. The parasitic capacitance on node 320 is the sum of transistor M11's gate parasitic capacitance, transistor M8's drain parasitic capacitance, and transistor M6's drain parasitic capacitance.

The output from transconductance stage 202 is taken across nodes 310 and 320 as shown. Transconductance stage 204 includes transistors M10-M18. In this example, transistors M10, M11, M12, M17, and M18 are NMOS transistors, and transistors M13, M14, M15, and M16 are PMOS transistors. Node 310 is connected to gate of transistor M10, and node 320 is connected to the gate of transistor M11. Transistors M10 and M11 comprise the input transistors of transconductance stage 204. The sources of transistors M10 and M11 are connected together and to the drain of transistor M12. The gate of transistor M12 is biased at bias voltage BIAS2 to cause a tail current to flow through transistor M10 or through transistor M11 depending on the relative sizes of the transconductance stage 204 input voltages on the gates of transistors M10 and M11.

The sources of transistors M13 and M14 are connected together and to the supply voltage node VDDA. The gates of transistors M13 and M14 are connected together and to a bias voltage BIAS3. The drain of transistor M13 is connected to the source of transistor M15, and the drain of transistor M14 is connected to the source of transistor M16. The gates of transistors M15 and M16 are connected together and to a bias voltage BIAS4. The drains of transistors M15 and M17 are connected together at a node 330. The drains of transistors M16 and M18 are connected together at a node 340. Resistor R2 from FIG. 2 is connected between nodes 330 and 340 as shown. The drain and source of transistor M17 are connected together, as well as to the gate of transistor M18. The sources of transistors M12, M17, and M18 are connected together and to the negative supply voltage node VSSA. Node 340 is connected to the gate of transistor M3. Capacitor C2 is the sum of the parasitic capacitance of transistor M3, the drain parasitic capacitance of transistor M16, and the drain parasitic capacitance of transistor M18.

Figure 4:
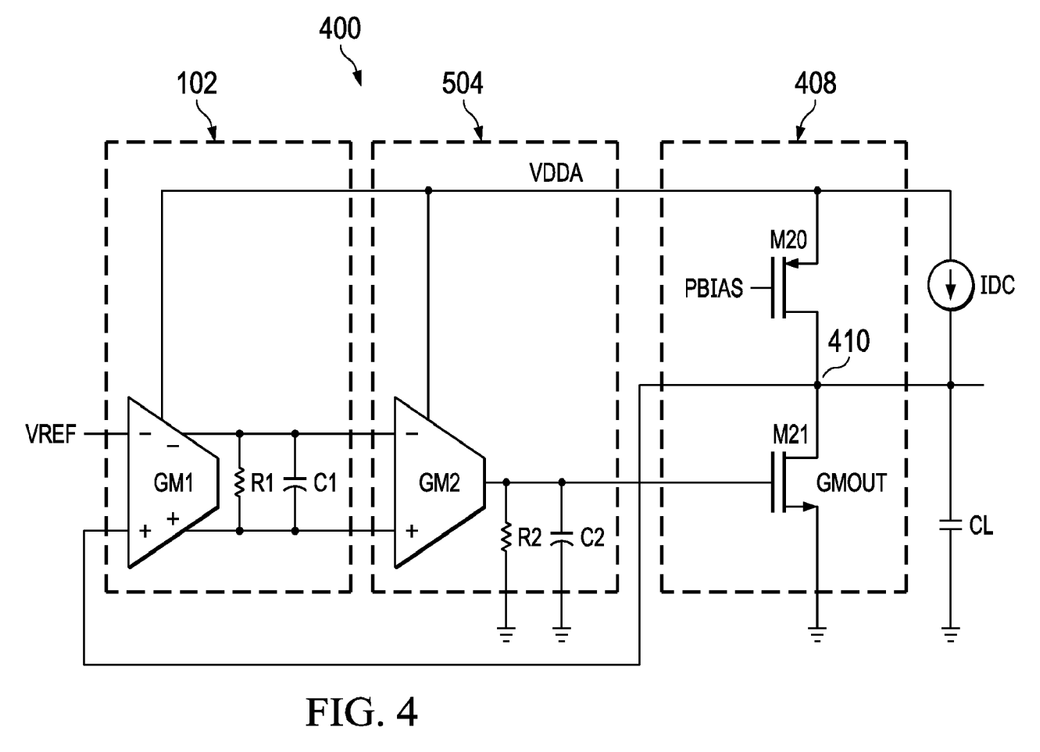
FIG. 4 illustrates another example of an op amp that has a limited output current range due to stability issues.

FIG. 4 shows an example op amp 400, similar to that of FIG. 1, but with an output transconductance stage 408 comprising PMOS transistor M20 and NMOS transistor M21. Transconductance stages 102 and 504 are the same or similar to stages 102 and 104, respectively, of FIG. 1. The source of transistor M20 is connected to the supply voltage node VDDA, and its drain is connected at output node 410 to the drain of transistor M21 and to capacitor CL as shown. The source of transistor M21 is connected to ground. The load current in this example is a "sink" current in that current flows from supply voltage node VDDA, through the load, and through transistor M21 to ground. The bandwidth of op amp 400 is dictated by Eq. (1) above and thus op amp 400 suffers from the same stability problem as op amp 100 (instability due to increasing DC load current IDC becoming.

Figure 5:
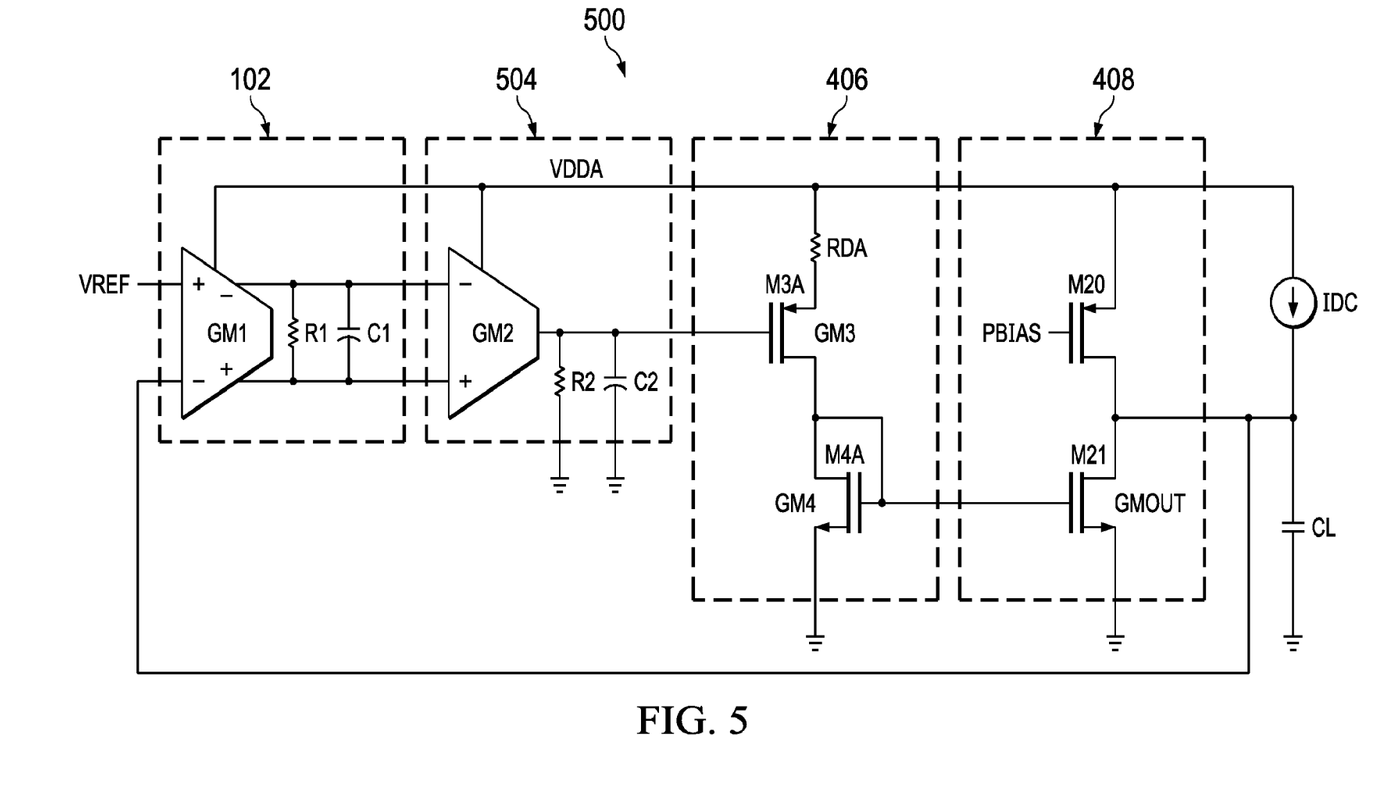
FIG. 5 illustrates an op amp that addresses the stability issues of FIG. 4.

FIG. 5 is an example of an op amp 500 that solves the stability problem of op amp 400 of FIG. 4 in much the same way as described above regarding FIG. 3. That is, an interim transconductance stage 406 is included between transconductance stage 504 and output transconductance stage 408. Transconductance stage 406 includes transistors M3A, M4A, and resistor RDA. In this example, transistor M4A is an NMOS transistor, and transistor M3A is a PMOS transistor. The source of transistor M4A is connected to ground, the and drains of transistors M4A and M3A are connected together. The gates of transistors M4A and M21 are connected together and to the drain of transistor M4A. The sources of transistors M4A and M21 are connected together. As such, transistors M4A and M21 are configured as a current mirror, as was the case for transistors M1 and M4 in the example of FIG. 2.

Resistor RDA is connected between the source of transistor M3A and the supply voltage node VDDA, thereby configuring transistor M3A as a source-degenerated transistor, as was the case for source-degenerated transistor M3 in FIG. 2. The bandwidth of op amp 400 is dictated by Eqs. (2) and (3). Thus, the effect of including source-degenerated transistor M3A is that the bandwidth of op amp 500 does not change nearly as dramatically with changes in DC load current as would be the case for op amp 400 of FIG. 4. As such, op amp 500 is more stable (has a larger phase margin) over a larger range of DC load currents than op amp 400.

Figure 6:
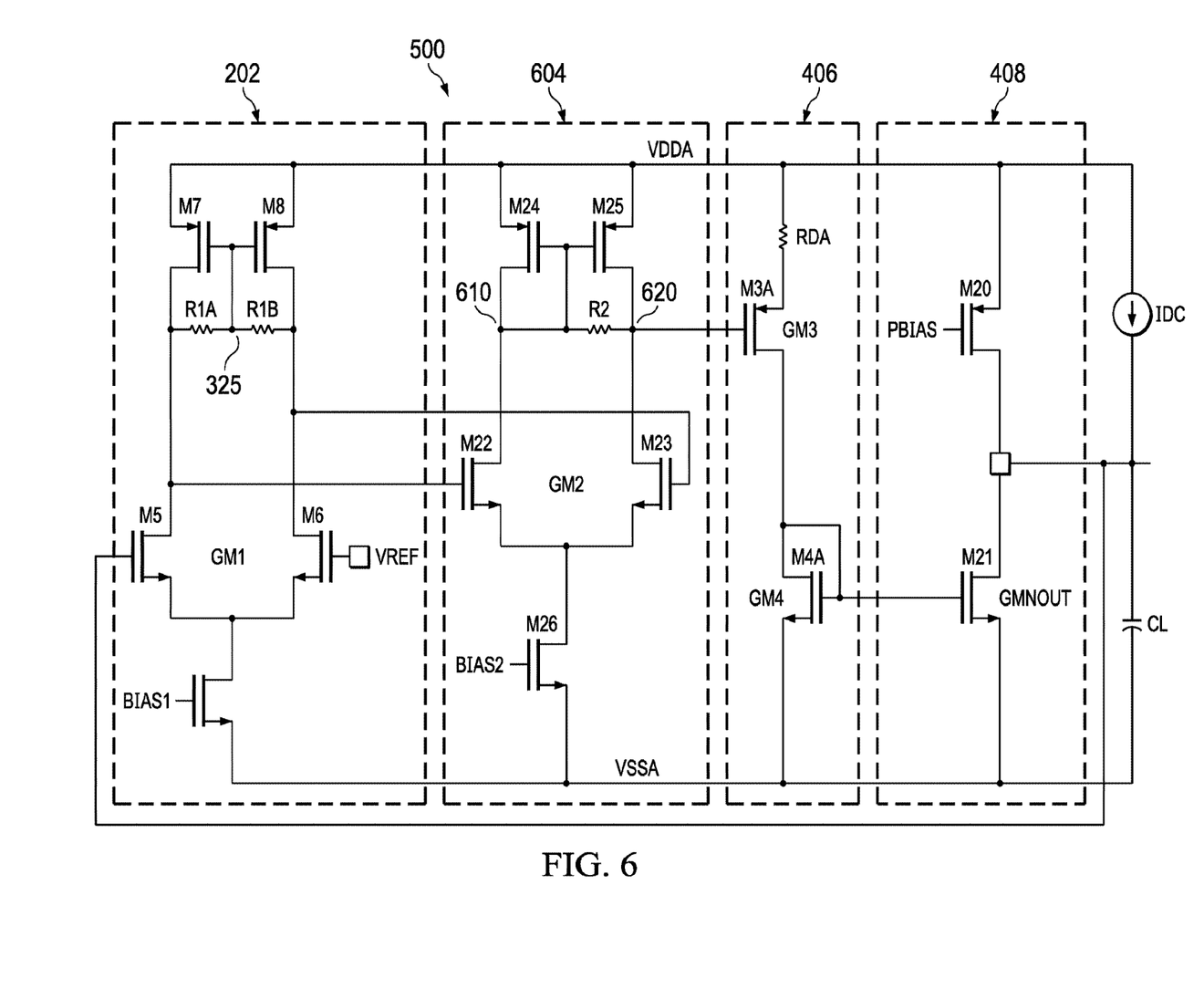
FIG. 6 shows a more detailed schematic of the example of FIG. 4.

FIG. 6 shows a more detailed schematic of the op amp 500 of FIG. 2. Additional detail is show for transconductance stages 102 and 504 of FIG. 5. Input transconductance stage 102 in FIG. 6 has transistors M5-M8 and configured in the same circuit architecture as the input transconductance stage 102 of FIG. 3. Transconductance stage 504 in FIG. 6 includes transistors M22-M25 and resistor R2. Transistors M22, M23, and M26 are NMOS transistors, and transistors M24 and M25 are PMOS transistors. The sources of transistors M24 and M25 are connected together and to the supply voltage node VDDA. The drains of transistors M24 and M22 are connected together at node 610, and the drains of transistors M25 and M23 are connected together at node 620. Resistor R2 connects between nodes 610 and 620, and node 610 also connects to the gates of transistors M24 and M25. The sources of transistors M22 and M23 are connected to the drain of transistor M26. The source of transistor M26 is connected to VSSA. The gate of transistor M26 is biased via BIAS2. Node 620 is connected to the gate of transistor M3A.

Figure 7:
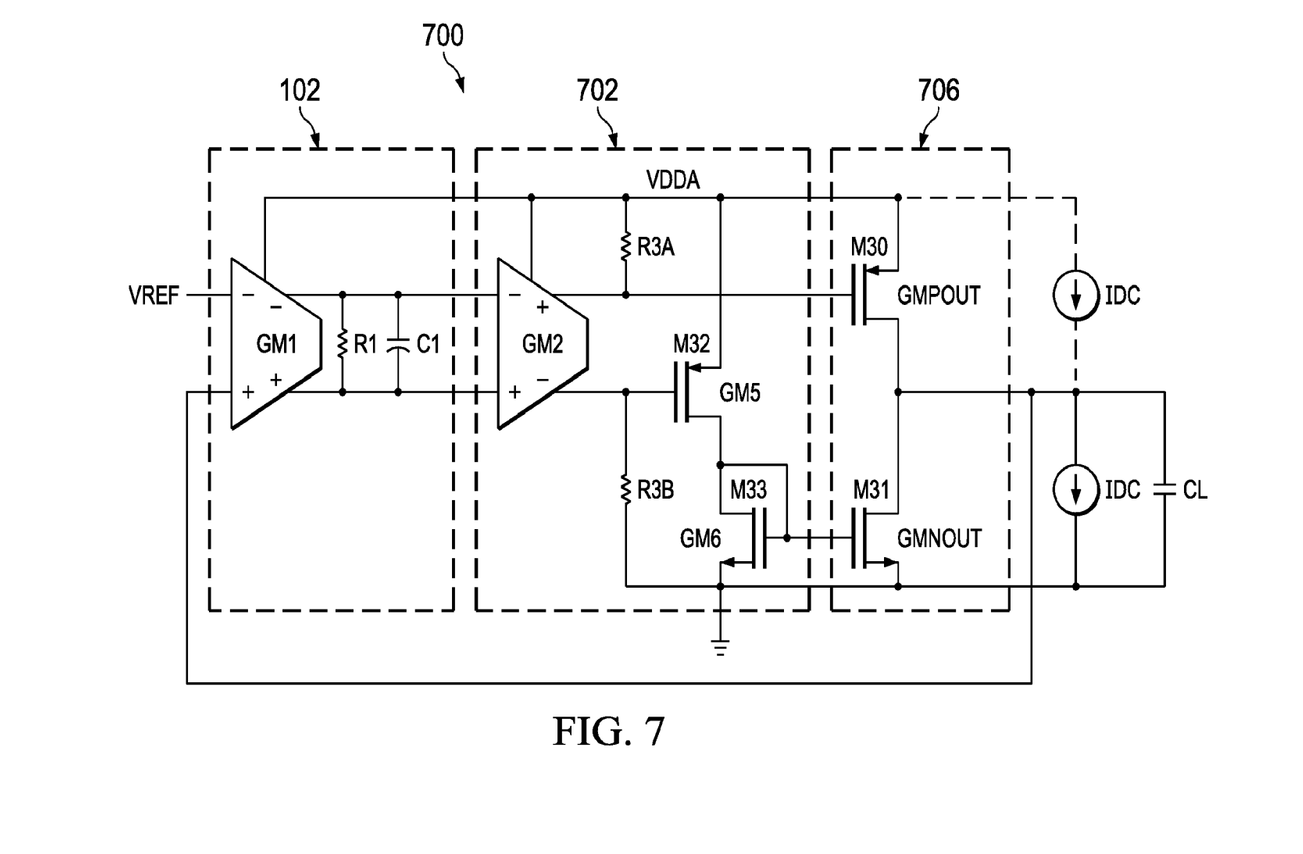
FIG. 7 illustrates another example of an op amp with a class AB output stage that has a limited output current range due to stability issues.

The examples of FIGS. 1-6 include examples of op amps with a class A output stage, that is, an output stage that only sources (or sinks) current. For example, in FIGS. 1-3, the op amps' output transconductance stage source current to the load, whereas in the example of FIGS. 4-6, the op amps' output transconductance stage sinks current from the load. FIG. 7 shows an example of an op amp 700 in which the output transconductance stage 706 includes PMOS transistor M30 connected to NMOS transistor M31. In one direction, current flows from VDDA, through transistor M30, through the load, and through capacitor CL. In the opposite direction, current flows from the load and through transistor M31 to ground. The transconductance of transistor M30 is GMPOUT, and the transconductance of transistor M31 is GMNOUT.

Op amp 700 includes input transconductance stage 102 (described above) as well as transconductance stage 702. Transconductance stage 702 includes transconductance amplifier GM2, resistors R3A and R3B, and transistors M32 and M33. The resistance of R3A is the same as the resistance of R3B. The transconductance of transistor M32 is GM5, and the transconductance of transistor M33 is GM6. The bandwidth of op amp 700 PGP-22X $$BW = \frac{GM1*R1*GM2*R3}{CL}\left[\frac{GM5*GMNOUT}{GM6} + GMPOUT\right] \quad (4)$$

where R3 is the resistance of R3A and R3B. The same instability problem is present in op amp 700 as was the case for op amp 100 in FIG. 1 and for op amp 400 in FIG. 4. That is, as the load current increases for op amp 700, GMPOUT of transistor M30 or GMNOUT of transistor M31 increase and thus the bandwidth increases, resulting in the non-dominant poles being at frequencies within the bandwidth of the op amp.

Figure 8:
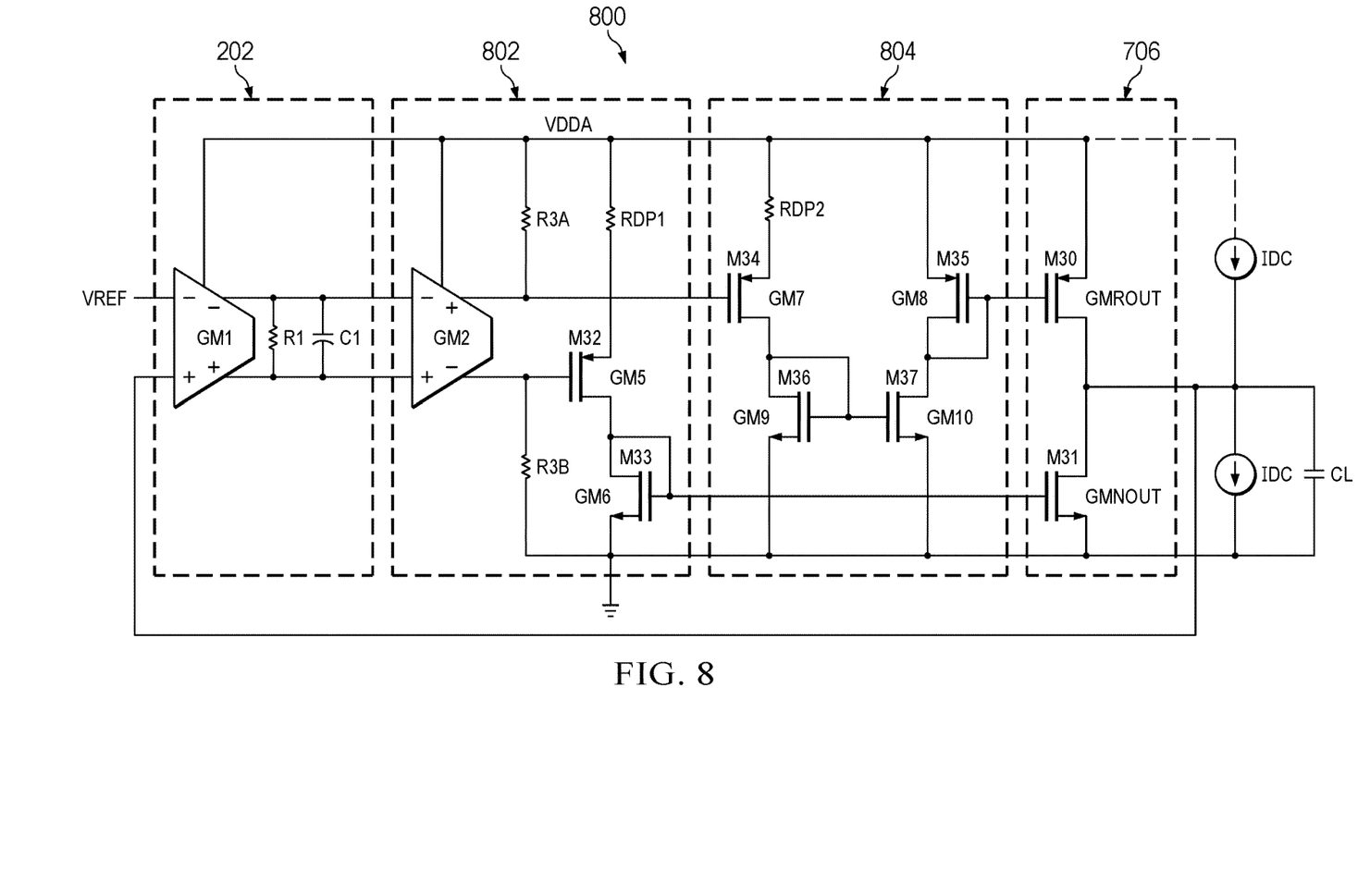
FIG. 8 shows illustrates an op amp that addresses the stability issues of FIG. 7.

FIG. 8 shows an op amp 800 that addresses the instability problem of op amp 700 of FIG. 7. Op amp 800 includes input transconductance stage 202, transconductance stage 802, transconductance stage 804, and output transconductance stage 706. Transconductance stages 802 and 804 are coupled between input and output transconductance stages 202 and 706. Transconductance stage 802 is similar to transconductance stage 702 of FIG. 7, but a resistor RDP1 is connected between the source of transistor M32 and VDDA. As such, transistor M32 is source-degenerated.

Transconductance stage 804 includes transistors M34-M37 and resistor RDP2. Resistor RDP2 connects between the source of transistor M34 and VDDA, and thus configures transistor M34 as a source-degenerated transistor. The drain of transistor M34 connects to the drain of transistor M36 and to the gates of transistors M36 and M37. The drains of transistors M35 and M37 are connected together, and are connected to the gates of transistors M35 and M30. The sources of transistors M35 and M30 are connected to together at the supply voltage node VDDA. The sources of transistors M36 and M37 are connected to ground. Transistors M35 and M30 are configured as a current mirror. Transistors M36 and M37 also are configured as a current mirror.

The transconductance of transistors M34, M35, M36, and M37 are GM7, GM8, GM9, and GM10, respectively. Resistor RDP1 degenerates and limits the effective transconductance of transistor M32, and similarly, resistor RDP2 degenerates and limits the effective transconductance of transistor M34. Transconductance stage 804 facilitates the degeneration of transistor M34, and is a relatively low gain, high bandwidth stage. The bandwidth of op amp 800 is provided in Eq. (5) below:

$$BW = \frac{GM1*R1*GM2*R3}{CL}\left[\frac{GM5}{1+GM5*RDP1}*\frac{GMNOUT}{GM6} + \frac{GM7}{1+GM7*RDP2}*\frac{GM10}{GM9}*\frac{GMPOUT}{GM8}\right] \quad (5)$$

Changes in the load current cause corresponding changes in GMPOUT as explained above. Because transistors M30 and M35 are configured as a current mirror, the drain current through transistor M35 tracks the drain current through transistor M30, and thus GM8 of transistor M35 also changes proportional to changes in GMPOUT. As can be observed from Eq. (5), the bandwidth of op amp 800 is a function of the ratio of GMPOUT to GM8. As such, changes in the load current that causes a change in GMPOUT does not substantially change the bandwidth of the op amp. The bandwidth is also a function of the ratio of GM7 to 1+(GM7)(RDP2). GM7 may change with changing load current, but as GM7 increases, the ratio of GM7 to 1+(GM7)(RDP2) approaches 1/GM7. The bandwidth is further a function of the ratio of GM5 to 1+(GM5)(RDP1). GM5 may change with changing load current, but as GM5 increases, the ratio of GM5 to 1+(GM5)(RDP1) approaches a limit 1/GM5.

Figure 9:
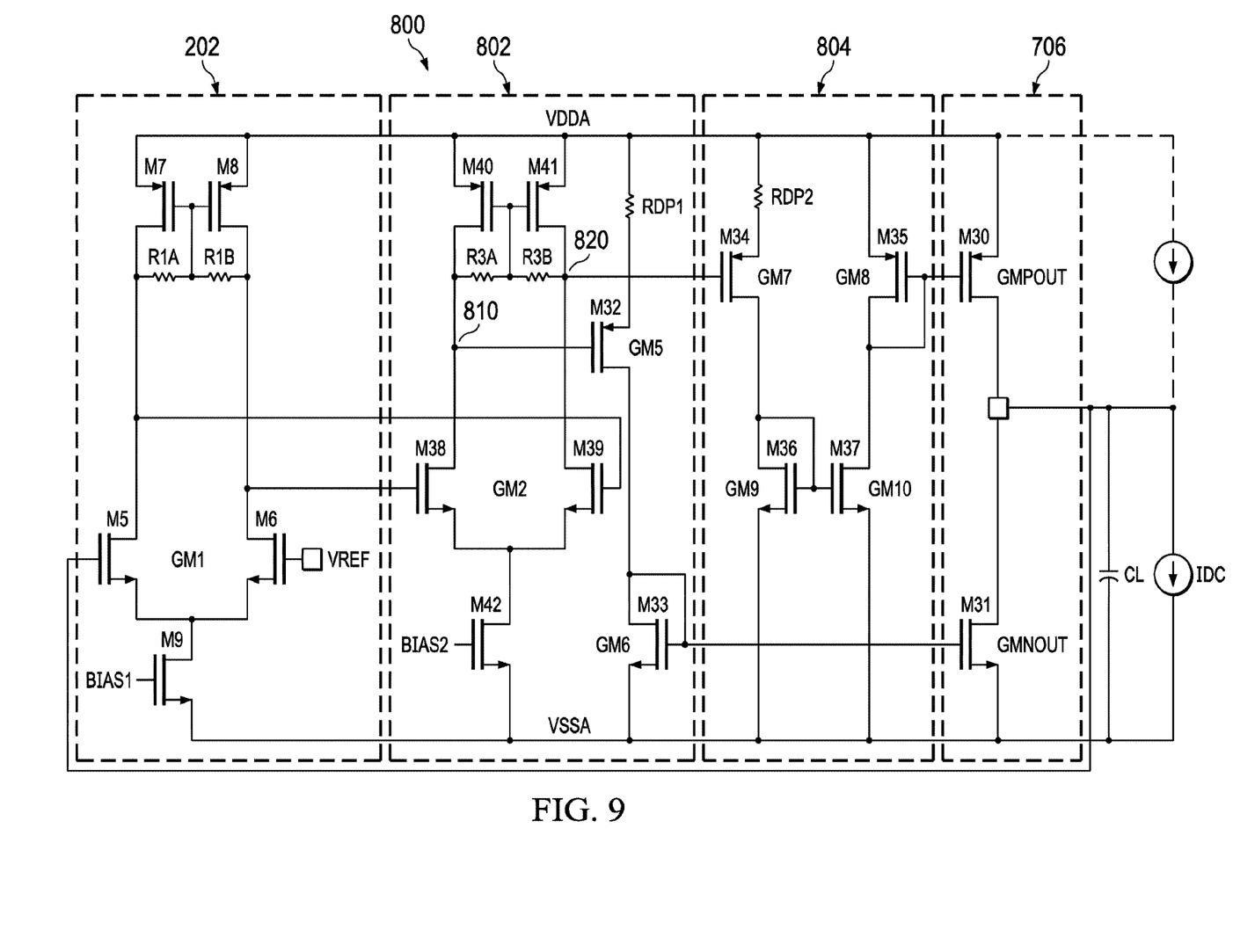
FIG. 9 shows a more detailed schematic of the example of FIG. 8.

FIG. 9 also illustrates op amp 800, but with additional detail. Input transconductance stage 202 is implemented the same as shown in FIG. 3 and described above. Transconductance stage 802 in FIG. 9 includes transistors M33 and M38-M42 and resistor RDP1. Transistors M38, M39, and M42 are NMOS transistors, and transistors M40 and M41 are PMOS transistors. The sources of transistors M40 and M41 are connected together and to the supply voltage node VDDA. The drains of transistors M40 and M38 are connected together at node 810, and the drains of transistors M41 and M39 are connected together at node 820. Resistors R3A and R3B are connected in series between nodes 810 and 820, and the node between the resistors R3A and R3B is connected to the gates of transistors M40 and M41. The sources of transistors M38 and M39 are connected to the drain of transistor M42. The source of transistor M46 is connected to VSSA. The gate of transistor M42 is biased via BIAS2. Node 820 is connected to the gate of transistor M34.

Figure 10:
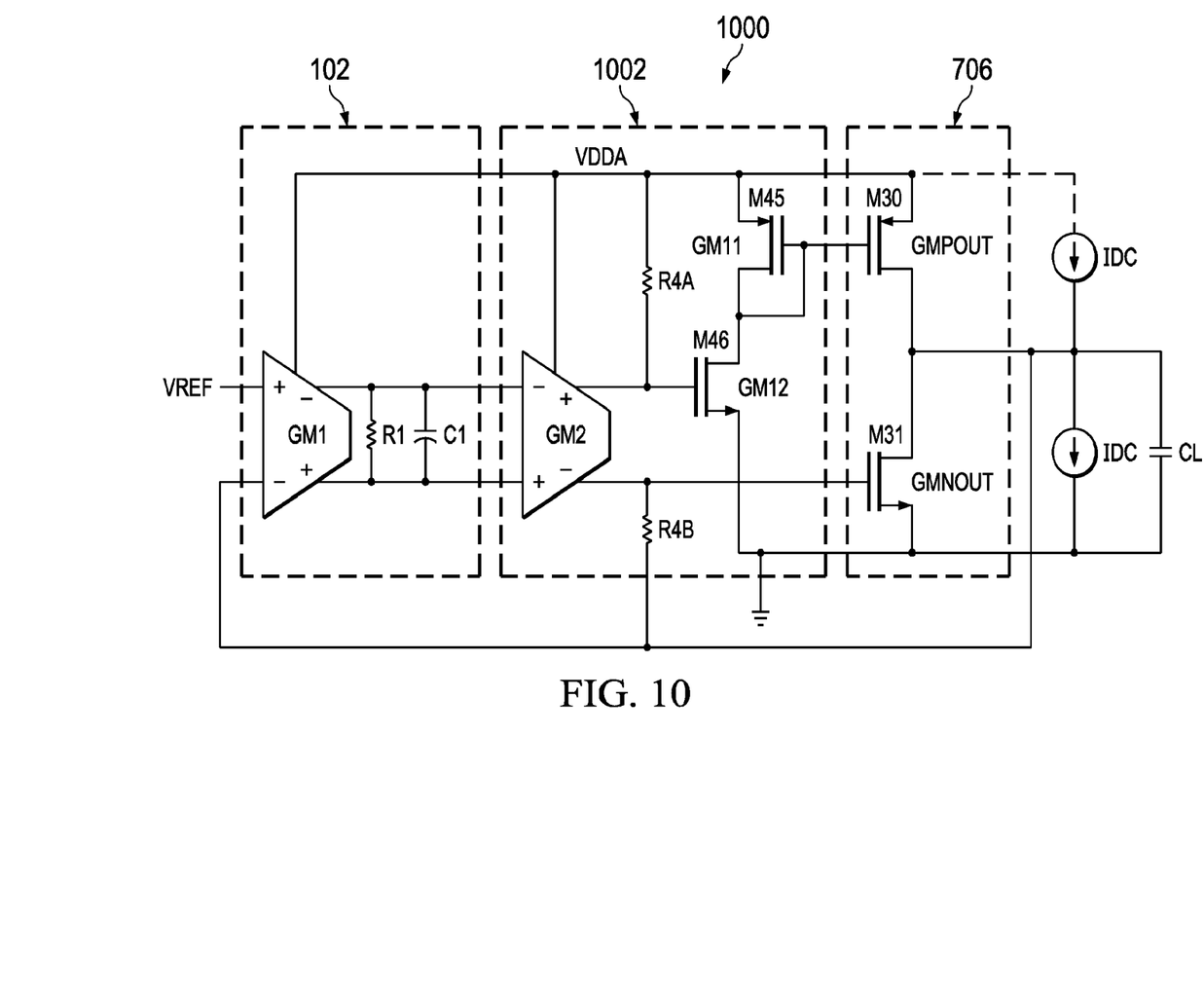
FIG. 10 illustrates another example of an op amp with a class AB output stage that has a limited output current range due to stability issues.

FIG. 10 shows an example of op amp 1000 with a class AB output transconductance stage 706 as was the case for op amp 700 in FIG. 7. The input transconductance stage 102 of op amp 1000 also is the same as input transconductance stage 102 of op amp 700 in FIG. 7. Interim transconductance stage 1002 includes transconductance amplifier GM2, resistors R4A and R4B, and transistors M45 and M46. The transconductance of transistor M45 is GM11, and the transconductance of transistor M46 is GM12. Transistor M45 is a PMOS transistor, and transistor M46 is an NMOS transistor. The drains of transistors M45 and M46 are connected together and to the gates of transistors M45 and M30. Transconductance amplifier GM2 drives the gate of transistors M46 and M31. Op amp 1000 suffers from the same instability problem as for op amp 700.

Figure 11:
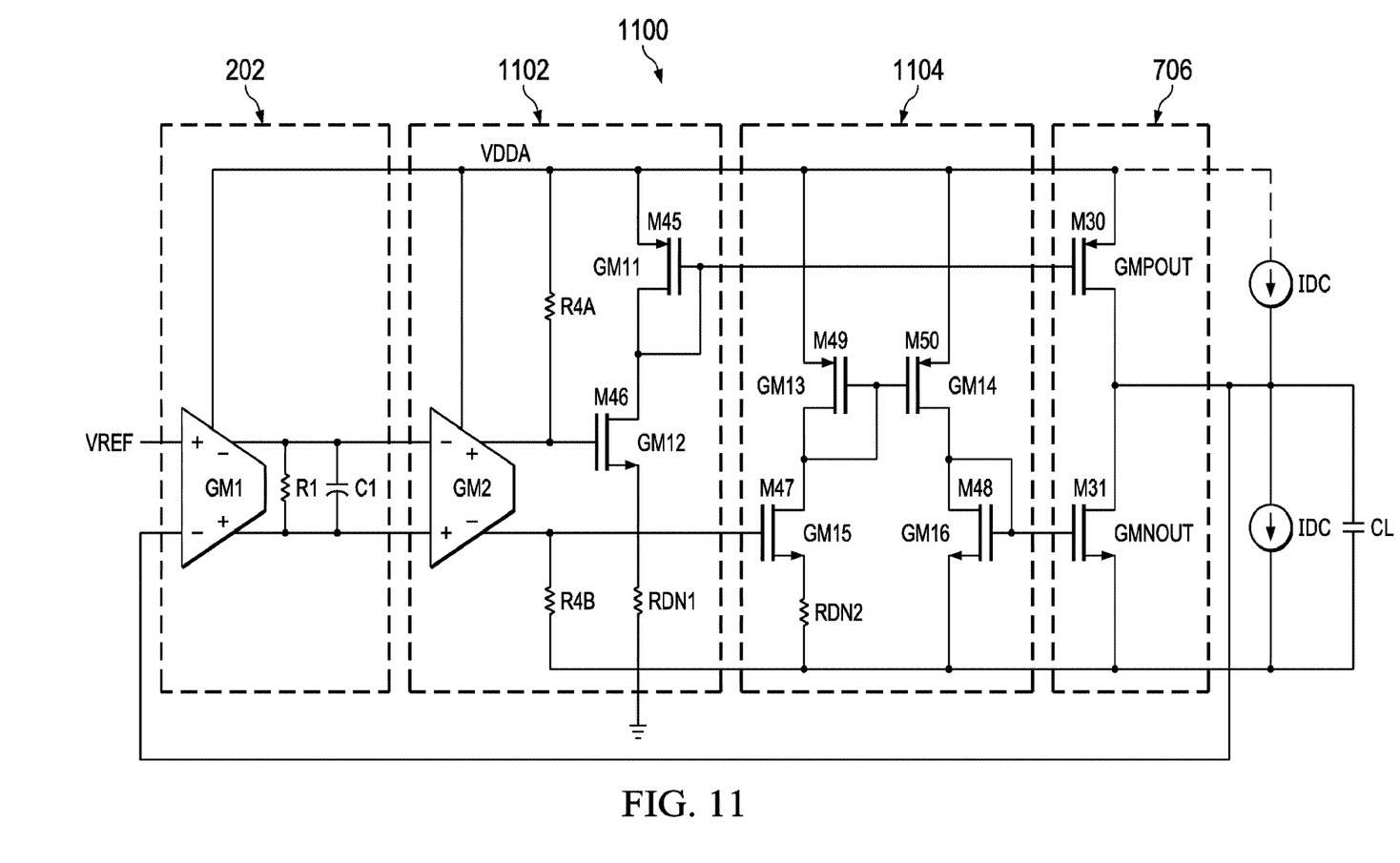
FIG. 11 shows illustrates an op amp that addresses the stability issues of FIG. 10.

FIG. 11 shows an op amp 1100 that addresses the instability problem of op amp 1000 of FIG. 10. Op amp 1100 includes input transconductance stage 202, transconductance stage 1102, transconductance stage 1104, and output transconductance stage 706. Transconductance stages 1102 and 1104 are coupled between input and output transconductance stages 202 and 706. Transconductance stage 1102 is similar to transconductance stage 1002 of FIG. 10, but a resistor RDN1 is connected between the source of transistor M46 and ground. As such, transistor M46 is source-degenerated.

Transconductance stage 1104 includes transistors M47-M50 and resistor RDN2. Resistor RDN2 connects between the source of transistor M47 and ground, and thus configures transistor M47 as a source-degenerated transistor. The drain of transistor M47 connects to the drain of transistor M49 and to the gates of transistors M49 and M50. The drains of transistors M48 and M50 are connected together, and are connected to the gates of transistors M48 and M31. The sources of transistors M48 and M31 are connected to together at the ground node. The sources of transistors M36 and M37 are connected to ground. Transistors M48 and M31 are configured as a current mirror. Transistors M49 and M50 also are configured as a current mirror.

The bandwidth of op amp 1100 is given by Eq. (6).

$$BW = \frac{GM1*R1*GM2*R3}{CL}\left[\frac{GM12}{1+GM12*RDN1}*\frac{GMPOUT}{GM11} + \frac{GM15}{1+GM15*RDN2}*\frac{GM14}{GM13}*\frac{GMNOUT}{GM16}\right] \quad (6)$$

Changes in the load current cause corresponding changes in GMNOUT. Because transistors M31 and M48 are configured as a current mirror, the drain current through transistor M48 tracks the drain current through transistor M31, and thus GM16 of transistor M48 also changes proportional to changes in GMNOUT. As can be observed from Eq. (6), the bandwidth of op amp 1100 is a function of the ratio of GMNOUT to GM16. As such, changes in the load current that causes a change in GMNOUT do not substantially change the bandwidth of op amp 1100. The bandwidth is also a function of the ratio of GM15 to 1+(GM15)(RDN2). GM15 may change with changing load current, but as GM15 increases, the ratio of GM15 to 1+(GM15)(RDN2) approaches 1/GM15. The bandwidth is further a function of the ratio of GM12 to 1+(GM12)(RDN1). GM12 may change with changing load current, but as GM12 increases, the ratio of GM12 to 1+(GM12)(RDN1) approaches 1/GM12. By degenerating the sources of transistors M46 and M47 and including the current mirrors M48/M31 and M49/M50, the bandwidth of op amp 1100 does not change nearly as dramatically with changes in DC load current as would be the case for op amp 1000 of FIG. 10. As such, op amp 1100 is more stable (has a larger phase margin) over a larger range of DC load currents than op amp 1000.

Figure 12:
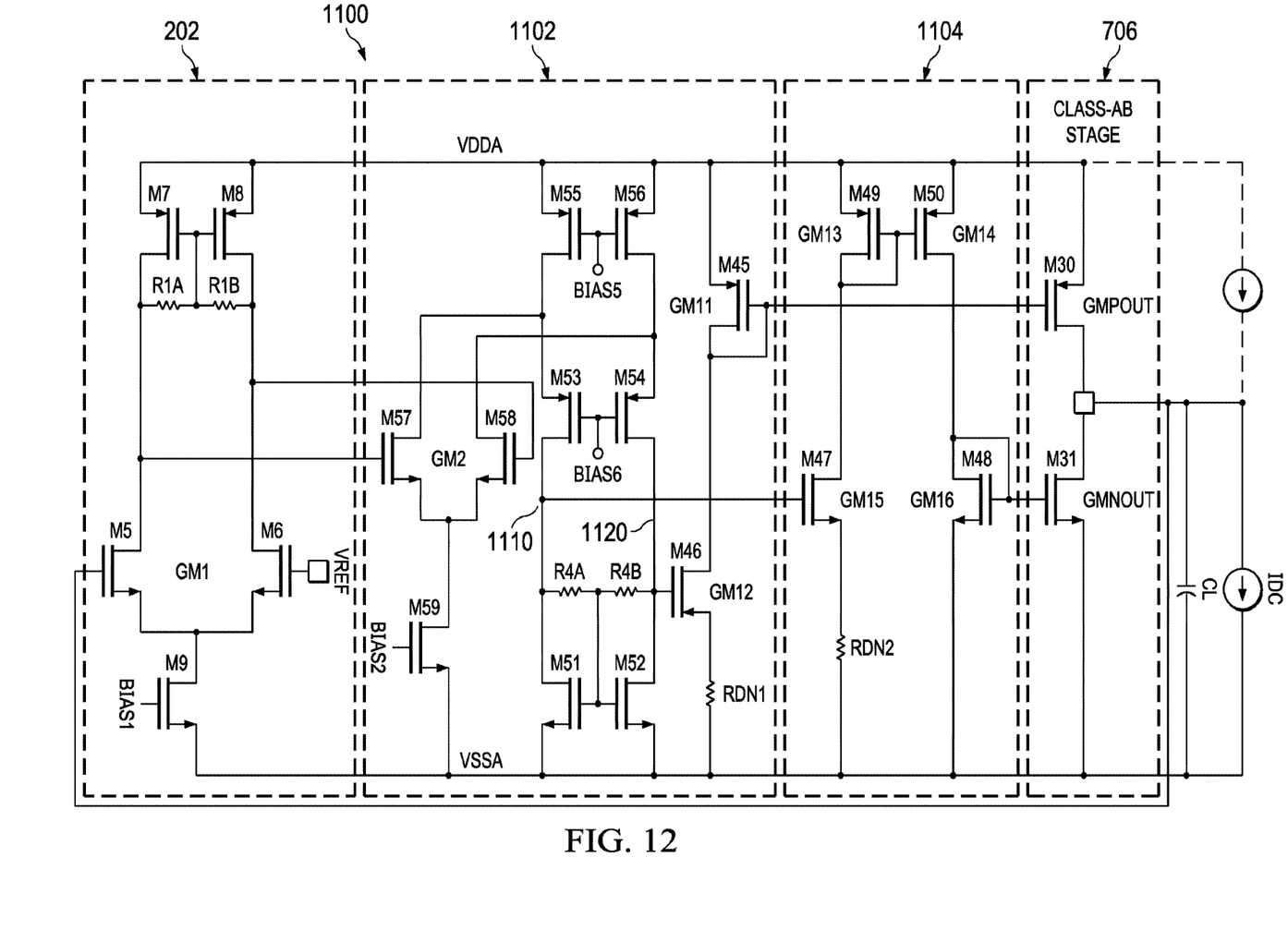
FIG. 12 shows a more detailed schematic of the example of FIG. 11.

FIG. 12 also illustrates op amp 1100, but with additional detail. Input transconductance stage 202 is implemented the same as shown in FIG. 3 and described above. Transconductance stage 1102 in FIG. 12 includes transistors M51-M59 and resistor RDN1. Transistors M57 and M58 comprise an input transistor pair, and transistor M59 is biased by a voltage BIAS2. Transistors M51 and M52 are NMOS transistors, and transistors M53-M56 are PMOS transistors. The sources of transistors M55 and M56 are connected together and to the supply voltage node VDDA. The gates of transistors M55 and M56 are biased by BIAS5. The drain of transistor M55 is connected to the source of transistor M53 and to the drain of transistor M57, and the drain of transistor M56 is connected to the source of transistor M54 and to the drain of transistor M58. The gates of transistors M53 and M54 are biased by BIAS6. The drains of transistors M53 and M51 are connected together at node 1110, and the drains of transistors M54 and M52 are connected together at node 1120. Resistors R4A and RBB are connected in series between nodes 1110 and 1120, and the node between the resistors R4A and R4B is connected to the gates of transistors M51 and M52. The sources of transistors M51 and M52 are connected to VSSA. Node 1110 is connected to the gate of transistor M47, and node 1120 is connected to the gate of transistor M46.

Modifications are possible in the described examples, and other examples are possible and within the scope of the claims.

What is claimed is:

1. A circuit, comprising:
   a first transconductance stage coupled to an input node;
   an output transconductance stage; and
   a second transconductance stage coupled between the first transconductance stage and the output transconductance stage, the second transconductance stage including a first source-degenerated transistor and a second transistor, wherein a current terminal of the second transistor is directly coupled to a current terminal of the first source-degenerated transistor.

2. The circuit of claim 1, wherein:
   the first source-degenerated transistor includes a control input and first and second current terminals, wherein one of the first and second current terminals is the current terminal of the first source-degenerated transistor.

3. The circuit of claim 2, wherein an output node of the first transconductance stage is coupled to the control input of the first source-degenerated transistor.

4. The circuit of claim 1, further comprising a second source-degenerated transistor coupled between the first transconductance stage and the output transconductance stage.

5. The circuit of claim 4, wherein the second source-degenerated transistor includes a control input coupled to an output node of the first transconductance stage.

6. The circuit of claim 1, wherein:
   the output transconductance stage includes a second transistor having a first control input and first and second current terminals;
   the second transistor comprises a second control input; and
   the second current terminal is coupled to the first and second control inputs.

7. The circuit of claim 1, wherein the second transistor comprises a second control input, and wherein:
   the output transconductance stage includes a third transistor including a third control input and third and fourth current terminals; and
   the second and third control inputs are coupled together.

8. The circuit of claim 1, wherein the second transistor comprises a second control input coupled to the current terminal of the second transistor and the current terminal of the first source-degenerated transistor.

9. A circuit, comprising:
   a first transconductance stage having an output;
   an output transconductance stage;
   a first source-degenerated transistor having a first control input and a first current terminal, the first control input coupled to the output of the first transconductance stage; and
   a second transistor having a second control input and a second current terminal, the second current terminal coupled to the first current terminal and to the output transconductance stage.

10. The circuit of claim 9, further comprising a second source-degenerated transistor coupled between the first transconductance stage and the output transconductance stage.

11. The circuit of claim 10, wherein the second source-degenerated transistor includes a third control input coupled to an output node of the first transconductance stage.

12. The circuit of claim 9, further comprising a second transconductance stage, wherein the first transconductance stage is coupled between the second transconductance stage and the first control input of the first source-degenerated transistor.

13. The circuit of claim 9, wherein the output transconductance stage is one of a class A or class AB output stage.

14. The circuit of claim 9, wherein the output transconductance stage includes a third transistor having third control input coupled to the second current terminal of the second transistor and to the second control input.

15. A circuit, comprising:
   a first transconductance stage having an output;
   a second transconductance stage having an input and an output, the input of the second transconductance stage coupled to the output of the first transconductance stage, the second transconductance stage including a first source-degenerated transistor having a first control input coupled to the output of the second transconductance stage, the second transconductance stage including a second transistor having a current terminal directly coupled to a current terminal of the first source-degenerated transistor;
   an output transconductance stage; and
   a third transconductance stage coupled between the second transconductance stage and the output transconductance stage.

16. The circuit of claim 15, wherein the second transconductance stage comprises a second source-degenerated transistor.

17. The circuit of claim 16, wherein the second transconductance stage comprises a transconductance amplifier having an output, and wherein the second source-degenerated transistor includes a control input coupled to the output of the transconductance amplifier.

18. The circuit of claim 17, wherein the third transconductance stage includes a current mirror coupled to the first source-degenerated transistor.

19. The circuit of claim 15, wherein the output transconductance stage includes an output, and the circuit further comprises a capacitor coupled to the output of the output transconductance stage.

20. The circuit of claim 15, wherein:
   the output transconductance stage includes a fourth transistor;
   the third transconductance stage includes a fifth transistor coupled to the first source-degenerated transistor; and
   the fourth transistor is coupled to the fifth transistor in a current mirror configuration.

* * * * *